March 13, 1956 W. S. MORTLEY 2,738,424

PULSE CONTROLLED OSCILLATOR ARRANGEMENTS

Filed July 20, 1953

Inventor:
Wilfrid Sinden Mortley
Attorneys:
Baldwin & Wight 2,738,424
Patented Mar. 13, 1956

2,738,424

PULSE CONTROLLED OSCILLATOR ARRANGEMENTS

Wilfrid Sinden Mortley, Great Baddow, England, assignor to Marconi's Wireless Telegraph Company Limited, London, England, a company of Great Britain Application July 20, 1953, Serial No. 369,191

Claims priority, application Great Britain July 24, 1952

4 Claims. (Cl. 250—36)

Figure 1:
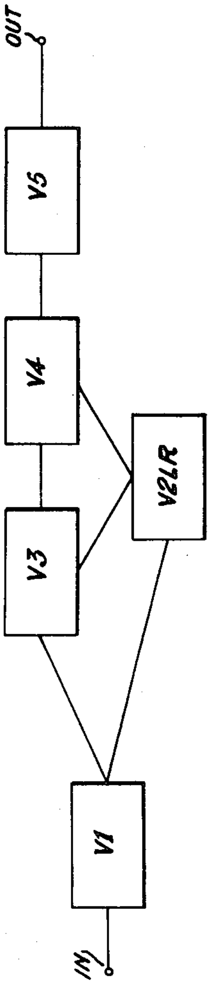

This invention relates to pulse controlled oscillator arrangements and has for its object to solve a difficult practical problem described below which commonly arises in radar equipment.

In many radar equipments it is necessary to provide an oscillator (generally termed a "coherent oscillator") whose phase is accurately governed for most of the duration of the pulse repetition period of the radar system by a short pulse of very high frequency oscillations provided by the said equipment. In some cases the coherent oscillator is constituted by a continuously oscillating circuit which is brought into correct phase relationship by direct injection into it of the controlling short pulse. This method of operation, however, is not always satisfactory because in order to dissipate, in the very short period of duration of the controlling pulse, energy of probably incorrect phase occurring in the circuit before the said pulse is applied, it is necessary that the said circuit shall be of low Q value. The use of a low Q value circuit in the oscillator is obviously most disadvantageous from the point of view of frequency stability and therefore of stability of phase during the relatively long, uncontrolled periods which occur between successive controlling pulses.

It has been proposed to overcome this difficulty by providing the oscillator with a circuit of high Q value and quenching it immediately prior to the occurrence of a controlling pulse for a period long enough to dissipate the energy in that circuit. This expedient however has the defect that it is difficult to produce a suitable switching pulse to effect quenching at the required moment while in many cases, notably in long range radar equipment, the time occupied by this quenching process is valuable and can ill be spared immediately before a controlling pulse though it would well be spared at the beginnings of the periods between successive controlling pulses.

The present invention seeks to provide improved pulse controlled oscillator arrangements which avoid the defects and disadvantages above mentioned.

According to this invention an oscillator arrangement wherein the phase of oscillations generated is required to be controlled by a repeated pulse of oscillations which is of short duration in relation to the repetition period comprises two valve oscillator circuits connected to supply energy to a common output circuit, an electronic switch interconnected with the two valve oscillators in such manner that in one position of the switching one valve oscillator is switched off and the other on while in the second position of said switch the reverse condition of oscillator valve conductivity is established and means for applying controlling pulses to change over the positions of the electronic switch so that on the occurrence of a pulse the first oscillator valve is switched on and the oscillator arrangement started in the correct phase and the second is switched off while at the end of a brief period the second oscillator valve is switched on and started in the correct phase by the first which is then switched off.

Preferably the electronic switch is a mono-stable multivibrator.

Preferably also the two oscillator valves feed into a common tank circuit.

Figure 2:
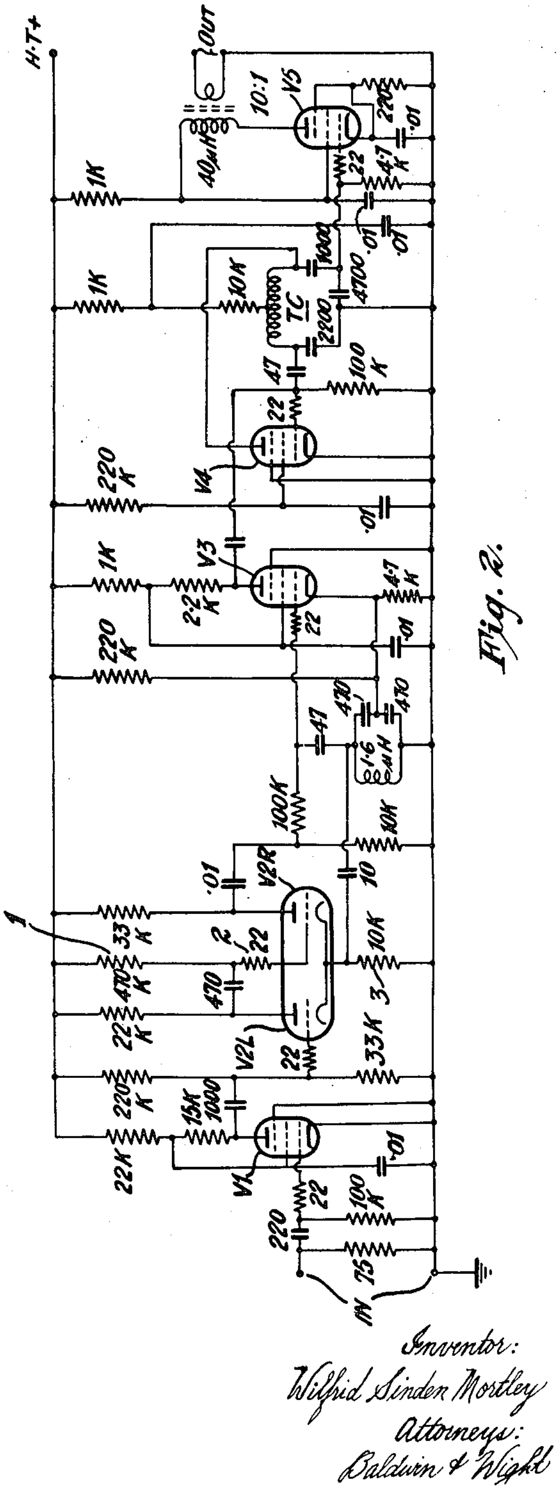

The invention is illustrated in the accompanying drawings in which Fig. 1 is a block diagram of an arrangement in accordance with this invention and Fig. 2 is a circuit diagram of the arrangement of Fig 1 showing it in more detail. In Fig. 2 typical practical values of components are indicated alongside the said components. These values are in micro-micro-farads in the case of condensers; in ohms or thousands of ohms (the latter being indicated by the letter $k$) in the case of resistances; and in micro-henries ($\mu$H) in the case of inductances. The ratio 10:1 indicated under the transformer to the right of Fig. 2 indicates the turn ratio of that transformer and the symbol over the representation of the core indicates that the core is movable in well known manner in relation to the coils for adjustment purposes.

Referring to Fig. 1 control pulses of very short duration—for example the pulses may have a repetition frequency of 250 per second and may be 4 micro-seconds long and consist of oscillations at 8 mc./s—are applied at In to a buffer amplifier V1 whose output controls a pair of oscillators marked V3 and V4 by means of an electronic switch marked V2LR. Oscillating output is supplied through a buffer amplifier V5 to an output terminal Out. The electronic switch V2LR controls the operation of the two oscillators as described below and although for simplicity in the block diagram of Fig. 1 the two oscillators are represented as though they were in simple direct cascade they, in fact, supply their outputs to the buffer amplifier V5 in alternation as will be more clearly seen in Fig. 2.

The operation of the arrangement of Fig. 1 is as follows: on the occurrence of an incoming controlling pulse the oscillator V3 is switched on for a brief period—for example 40 micro-seconds—and started in the correct phase by the incoming pulse the other oscillator V4 being at the same time switched off and its tank circuit driven by oscillations from the first oscillator wave. During the period in which the second oscillator V4 is switched off energy of the phase which was occurring before the arrival of the pulse dies away but energy of the correct phase produced by the first oscillator V3 is accumulated so as to be available to start the second oscillator V4 when it is switched on again in the correct phase. At the expiry of the short period during which the first oscillator is oscillating the said first oscillator is switched off and the second one in switched on continuing for the remaining period of a cycle of operations (3000 or 4000 micro-seconds) to supply the output to the tank circuit.

Referring to Fig. 2 the valve V1 is a simple buffer amplifier to whose control grid the controlling pulses are applied via terminals In. These pulses may be, for example, of one volt peak value ±10 db. The output of the valve V1 controls an electronic switch exemplified as comprising a double triode of which the left hand half is marked V2L and the right hand half V2R. For simplicity of description the two sections of this triode will be described as though they were two separate valves V2L and V2R.

The valves V2L and V2R are connected in manner well known per se to form a mono-stable multi-vibrator. During most of the pulse repetition period the valve V2R is conducting being maintained in this condition by virtue of positive potential applied to its control grid from the HT+ terminal through suitable resistances 1 and 2. During this period the valve V2L is cut off by reason of the relatively high potential of its cathode, the valves V2L and V2R being connected to the earth line through a common cathode resistance 3.

The valves V3 and V4 are oscillating valves supplying their inputs to a common tuned circuit TC. During the period in which the valve V2R is conducting and the valve V2L is cut off the valve V3 is cut off and the valve V4 is oscillating supplying its oscillations to the tank circuit TC. On the application of a control pulse at In the grid of the valve V2L is driven positive causing this valve to become conductive and the valve V2R to be cut off due to the normal unstable regenerative action of positive feedback in the multi-vibrator circuit of which the valves V2L and V2R form part. The resulting positive change of voltage at the anode of valve V2R is fed to the control gird of the valve V3 and switched on the first oscillator of which said valve V3 forms part. Simultaneously the valve V2L acts as a cathode follower coupling the incoming control pulses to the first oscillator to start it in the correct phase as determined by the control pulse.

When the valve V3 is switched on there is a fall of potential in its anode-cathode circuit and this is passed to the grid of the valve V4 of the second oscillator cutting it off. The previously occurring oscillatory current (due to the previously operating valve V4) in the associated tuned circuit TC then dies away while another oscillator current of the correct phase and delivered by the valve V3 is generated in said tuned circuit which, as will be seen, is connected to be fed from either of the valves V3 and V4.

After a short period determined by the constants of the circuit and which may in practice be about 40 microseconds, the multi-vibrator returns to its original stable condition with the valve V2R conducting and the valve V2L cut off. Accordingly the first oscillator valve V3 will be cut off again and the second oscillator valve V4 switched on to maintain the tuned circuit energy in the phase in which it was previously started by the valve V3. The cutting off of the anode current of this valve V3 ensures that there is no appreciable de-grading of the stability of the oscillator valve V4 during the remainder of the cycle of operations. The second oscillator should be designed to have good short term stability of frequency and it is for this reason that the control grid of the output buffer amplifier valve V5 which feeds the final output terminals Out is tapped well down to a fairly low impedance point on the circuit as will be clear from Fig. 2.

Any signal coupled back from the second oscillator valve V4 to the first V3 must be small in comparison with the input signal or "phase jitter" will be caused. However, this is not a serious practical difficulty and in an experimental arrangement in which the input control pulse signal was of one volt peak value and the oscillator coils were mounted on a brass chassis abut 4" apart without screening the "jitter" at the end of 4000 micro-seconds was less than 3° (total). This good result could probably be further improved on by providing screening.

It is not necessary for the first oscillator V3 to be as steady as the second but if there is any jitter in the brief switch period its frequency must not differ greatly from that of the second. Usually a difference not exceeding 1% will be satisfactory.

I claim:

1. In an oscillator arrangement wherein the phase of oscillations generated is controlled by a repeated pulse of oscillations which is of short duration in relation to the repetition period, a pair of valve oscillator circuits connected to supply energy to a common output circuit, an electronic switch interconnected with said valve oscillators and having one position wherein one valve oscillator is switched off and the other is switched on and a second position wherein said one valve oscillator is switched on and said other valve oscillator is switched off and means for applying controlling pulses to change over the positions of the electronic switch whereby on the occurrence of a pulse said one valve oscillator is switched on and the oscillator arrangement started in the correct phase, means for applying the controlling pulse to said one valve oscillator means controlled by the current in said one valve oscillator for switching off the other valve oscillator and means to switch on said other valve oscillator at the end of a brief period, said other valve oscillator being started in the correct phase by said one valve oscillator which is then switched off.

2. An oscillator arrangement as set forth in claim 1 wherein the electronic switch is a mono-stable multivibrator.

3. An oscillator arrangement as set forth in claim 1 wherein the two valve oscillators have a common tank circuit.

4. An oscillator arrangement as set forth in claim 1 wherein the electronic switch is a mono-stable multivibrator and the two valve oscillators have a common tank circuit.

References Cited in the file of this patent

UNITED STATES PATENTS 2,491,387 Miller ---------------- Dec. 13, 1949